United States Patent
Kang

(10) Patent No.: US 7,439,591 B2
(45) Date of Patent: Oct. 21, 2008

(54) GATE LAYER DIODE METHOD AND APPARATUS

(75) Inventor: Woo-Tag Kang, Apex, NC (US)

(73) Assignee: Infineon Technologies AG, Munich (DE)

( * ) Notice: Subject to any disclaimer, the term of this patent is extended or adjusted under 35 U.S.C. 154(b) by 321 days.

(21) Appl. No.: 10/958,464

(22) Filed: Oct. 5, 2004

(65) Prior Publication Data

US 2006/0071257 A1    Apr. 6, 2006

(51) Int. Cl.
H01L 23/62 (2006.01)
H01L 27/14 (2006.01)

(52) U.S. Cl. .............. 257/360; 257/355; 257/356; 257/E23.08; 257/E29.195; 257/E29.328; 438/369; 438/372

(58) Field of Classification Search ........... 257/355, 257/356, 360; 438/369, 372
See application file for complete search history.

(56) References Cited

U.S. PATENT DOCUMENTS

| | | | |
|---|---|---|---|
| 4,236,831 A * | 12/1980 | Hendrickson | 257/49 |
| 5,248,623 A * | 9/1993 | Muto et al. | 438/491 |
| 6,002,627 A | 12/1999 | Chevallier | |
| 6,521,952 B1 * | 2/2003 | Ker et al. | 257/360 |
| 6,617,649 B2 * | 9/2003 | Chang et al. | 257/355 |
| 6,645,820 B1 * | 11/2003 | Peng et al. | 438/372 |
| 6,936,895 B2 * | 8/2005 | Manna et al. | 257/355 |
| 2002/0100950 A1 | 8/2002 | Babcock et al. | |
| 2004/0119130 A1 | 6/2004 | Peichl et al. | |

OTHER PUBLICATIONS

PCT International Search Report and Written Opinion dated Mar. 6, 2006.
Angela D. McConnell, Srinivasan Uma and Kenneth E. Goodson, *Thermal Conductivity of Doped Polysilicon Layers*, Journal of Microelectromechanical Systems paper identification No. JMEMS 0654, 2001.
Tristan Burg, Paul Munroe and Own Standard, *Telecommunication Materials—Teacher Reference*, 2001, School of Material Science and Engineering, University of New South Wales, Australia.
Carl-Mikael Zetterling, *Process Technology for Silicon Carbide Devices*, Docent Seminar, Mar. 21, 2000, Kungl Teknishka Högskolan.

* cited by examiner

*Primary Examiner*—Dao H Nguyen
(74) *Attorney, Agent, or Firm*—Patterson & Sheridan, L.L.P.

(57) ABSTRACT

Method, apparatus, and article of manufacture for a diode defined by a portion of a gate layer of an integrated circuit. Illustrative, non-limiting embodiments of the invention are provided, including a temperature compensated DRAM, a temperature compensated CPU, a temperature compensated logic circuit and other on-chip temperature sensor applications.

26 Claims, 10 Drawing Sheets

GATE LAYER DIODE METHOD AND APPARATUS

BACKGROUND OF THE INVENTION

1. Field of the Invention

The invention generally relates to a method for forming a diode from a portion of the gate layer of a semiconductor device, and to the diode formed within that portion of the gate layer.

2. Description of the Related Art

A diode is frequently employed as part of an integrated circuit, and may serve a variety of different functions including, but not limited to measurement of temperature of the nearby surrounding area on a chip on which it is fabricated, rectification of alternating current to direct current, band gap diode applications, and generator circuit diode applications.

A conventional diode formed on a silicon substrate typically contains a P+ shallow junction region, an N-well, and an N+ shallow junction region. A well is a defined region infused with a dopant. A dopant is a substance introduced into the silicon that is typically ionic in nature. FIG. 1 depicts a conventional diode 100 formed within a silicon substrate 110. An N-well 105 is doped with N ions. The diode contains a P+ shallow junction region 120, a terminal 140 to connect the P side of the diode externally, the N-well 105, an N+ shallow junction region 130 and a terminal 150 to connect the N side of the diode externally. The P+ shallow junction region 120 is heavily doped with P ions, usually as a result of implantation of an acceptor dopant such as boron. In FIG. 1, the P+ shallow junction region 120 contains a first sub-region 122 that typically has substantially uniform doping density, and a second sub-region 124 of progressively decreasing doping density one gets closer to boundary 170 between P-doped region and N-well. A region wherein doping density changes with distance traversed, is said to have a "doping profile." The portion of a diode doped with P ions is usually called the "anode" of the diode. The N+ shallow junction region 130 is heavily doped with N ions, usually as a result of implantation of a donor dopant such as arsenic or phosphorus. The density of N ions in the N+ shallow junction region 130 is typically higher than the density of N ions in the N-well 105. The portion of a diode doped with N ions is usually called the "cathode" of the diode. In FIG. 1 the cathode includes the N-well 105 and the N+ shallow junction region 130. Shallow Trench Isolation structures (STI) 160, typically consisting of an oxide of the substrate, serve to electrically insulate the regions 120 and 130 respectively, from regions of opposite polarity doping, where such insulation is desired.

Doping enhances the number of electrical carriers of one type—either positive-type or negative-type donor. N-doped regions typically have an excess of free electrons (negatively charged electrical carriers), while P-doped regions typically have an excess of "holes" (positively charged electrical carriers). When a P+ shallow junction region and an N-well are placed adjacent to one another, some of the free electrons from the N-well combine with holes from the P+ shallow junction region, forming a "depletion zone", which region is of essentially net zero charge. FIG. 1 shows a depletion zone 180.

A conventional diode allows current flow in one direction. (Other types of diodes, such as a Zener diode and a current regulator diode, may allow current to pass in both directions.) A reverse bias may be applied to the diode, wherein the electrical potential at the terminal 150 is higher than the electrical potential at the P+ shallow junction region terminal 140. Holes (positive carriers) within the P+ shallow junction region face an "uphill potential difference" when crossing boundary 170 from the P+ shallow junction region 120 to the N-well 105, and so will not travel from the P+ shallow junction region 120 to the N-well 105. Similarly, free electrons (negative carriers) in the N-well face an "uphill potential difference" when crossing boundary 170 from the N-well 105 to the P+ shallow junction region 120. Therefore, free electrons will not travel from the N-well 105 to the P+ shallow junction region 120. Hence, when reverse bias is applied via the contacts 140 and 150, there will be essentially zero current flow.

Applying a forward bias via the contacts 140 and 150 means that the electrical potential is higher on the P+ shallow junction side of the diode than on the N-well side of the diode. Forward bias causes a current to flow through the diode, because holes from the P+ shallow junction region 120 face a "downhill" potential difference when crossing the boundary 170 from the P+ shallow junction region 120 to the N-well 105. Free electrons face a "downhill" potential difference when crossing the boundary 170 from the N-well 105 to the P+ shallow junction region 120. Hence there is a net current flow across the boundary 170. Thus, the diode may serve as a current switch, allowing current to flow across the boundary 170 and through the contacts 140, 150 when forward bias is applied, and preventing current from flowing when reverse bias is applied.

In forward bias, the amount of current that flows depends on the voltage applied across the diode terminals. Above a "threshold voltage" (typically approximately 0.5 volts), the current flowing increases exponentially as the voltage across the terminals is increased. At voltages slightly above the threshold voltage (approximately 0.8-0.9 v), the diode behaves as a conductor, showing only a very small resistance to the movement of holes and free electrons across the boundary 170.

One function of that a diode may serve in an integrated circuit is a temperature sensor. To function as a temperature sensor, the diode's characteristic electrical behavior in response to temperature must be determined. To this end, a diode may be connected to a constant current circuit, which circuit may supply a forward bias voltage to the diode to maintain a constant current flow. FIG. 2 depicts an arrangement wherein current is supplied to a diode 210 by a constant current supply 220. A voltage-measuring device 230 measures forward bias supplied by the constant current supply 220. Within the approximate forward bias voltage range of 0.5-0.8V, the bias voltage needed to maintain a predetermined current is well-known to be inversely proportional to diode temperature, with the voltage needed being reduced by approximately 0.002V for each 1° C. rise in diode temperature. By varying the temperature of the diode and measuring the voltage needed to maintain a predetermined current flow, a temperature-voltage characteristic (also called a temperature-voltage characteristic curve) may be established. Once the temperature-voltage characteristic has been determined, the diode may then be used as a temperature measurement device for measuring, e.g., the temperature of the silicon chip on which the diode resides.

In a particular application as a temperature measurement device in an integrated circuit device, the measured temperature may, in turn, be used to control other devices whose operation depends on temperature. For example, the temperature measured by a diode temperature sensor may be used to control, e.g., the self-refresh current in a dynamic random access memory (DRAM), DRAM refresh period, or the current utilized by a logic circuit such as a central processing unit (CPU).

As device geometries continue to shrink with advances in circuit design and manufacturing techniques, the operating characteristics of diodes are affected. For example, a reduction in junction depth causes the doping profile to change within a conventional diode, which may affect the operating characteristics of the diode. A shallow junction depth has been found to result in a diode whose characteristics, such as voltage v. temperature, are not consistent among chips of identical design and layout, but instead vary considerably from chip to chip. With manufacturing geometries of integrated circuits becoming smaller (e.g., line widths less than 70 nm), design constraints typically dictate corresponding diode junction depths that are shallow (e.g., junction depths smaller than 500 Å). In order to use such diodes for measurement purposes, inconsistencies in diode characteristics would necessitate calibration of each individual diode, which is impractical when manufacturing large quantities of an integrated circuit. Hence shallow junction depth becomes problematic for diodes to be used in measurement applications on an integrated circuit. Furthermore, variations in the shallow trench isolation structure may be a contributing cause of non-linear doping profiles in a shallow junction situated adjacent to a shallow trench isolation structure, which in turn may result in inconsistent diode characteristics among diodes within an integrated circuit, or inconsistent diode characteristics between diodes of different integrated circuits.

Higher dopant density and deep junction tend to improve consistency of the diode temperature-voltage characteristic among integrated circuits of identical design and layout. However, as layout geometries become smaller, the dopant density of shallow junctions is correspondingly limited by design rules. Hence, the dopant density cannot simply be increased to offset inconsistencies in diode characteristics, such as the temperature-voltage characteristic, resulting from shallow diode junction depths. Therefore there is a need for a diode whose characteristics, such as voltage versus temperature, are consistent.

SUMMARY OF THE INVENTION

One embodiment of the invention provides a method for making a diode, comprising: providing a gate layer, doping a first portion of the gate layer with a first dopant to form an anode, and doping a second portion of the gate layer adjacent to the first portion with a second dopant to form a cathode.

Another embodiment of the invention provides a method for making a diode, comprising: providing a gate layer over a substrate; forming a first patterned photoresist layer on the gate layer, whereby a first exposed portion of the gate layer is defined; with the first patterned photoresist layer on the gate layer, doping the first exposed portion with a first dopant to form a first doped portion of the diode, resulting in an undoped region of the gate layer shielded by the first patterned photoresist layer; removing the first patterned photoresist layer; forming a second patterned photoresist layer on the first doped portion of the diode and extending at least partially over the undoped region, whereby a second exposed portion of the gate layer is defined from the undoped region; and with the second patterned photoresist layer on the first doped portion, doping the second exposed portion with a second dopant to form a second doped portion of the diode, wherein the first doped portion and the second doped portion define terminals of the diode.

Another embodiment of the invention provides a gate layer diode, comprising a gate layer having a first portion of the gate layer containing a first dopant to form a first doped portion of the diode and a second portion of the gate layer adjacent to the first portion containing a second dopant to form a second doped portion of the diode, wherein the first doped portion and the second doped portion define terminals of the diode.

Another embodiment of the invention provides a temperature-compensated dynamic random access memory (DRAM), comprising: a memory cell bank comprising one or more memory cells; one or more voltage generators, each having an output voltage that is input to the memory cell bank; a gate layer; and a gate layer diode formed in the gate layer comprising two gate layer diode terminals, wherein the voltage generators are configured to adjust their respective output voltages in response to a voltage change between the gate layer diode terminals.

Another embodiment of the invention provides a temperature-compensated logic circuit, comprising: a logic circuit; one or more voltage generators supplying an operating voltage to the logic circuit; and a gate layer diode having two terminals, wherein the voltage generators are configured to adjust their respective output voltages in response to a voltage change between the gate layer diode terminals. The logic circuit may comprise a central processing unit.

Another embodiment of the invention provides a chip, comprising: a gate layer; a gate layer diode formed in a first portion of the gate layer; and a transistor formed in a second portion of the gate layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In the following description, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Figure 1:
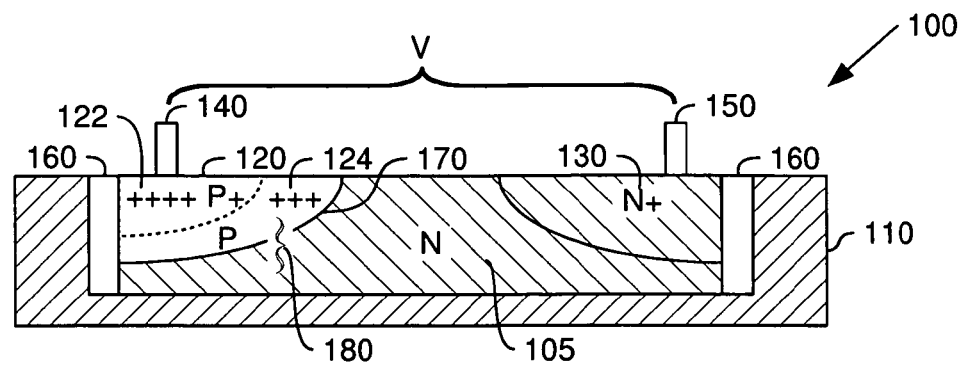
FIG. 1 (prior art) is a conventional diode formed within a silicon substrate.
Figure 2:
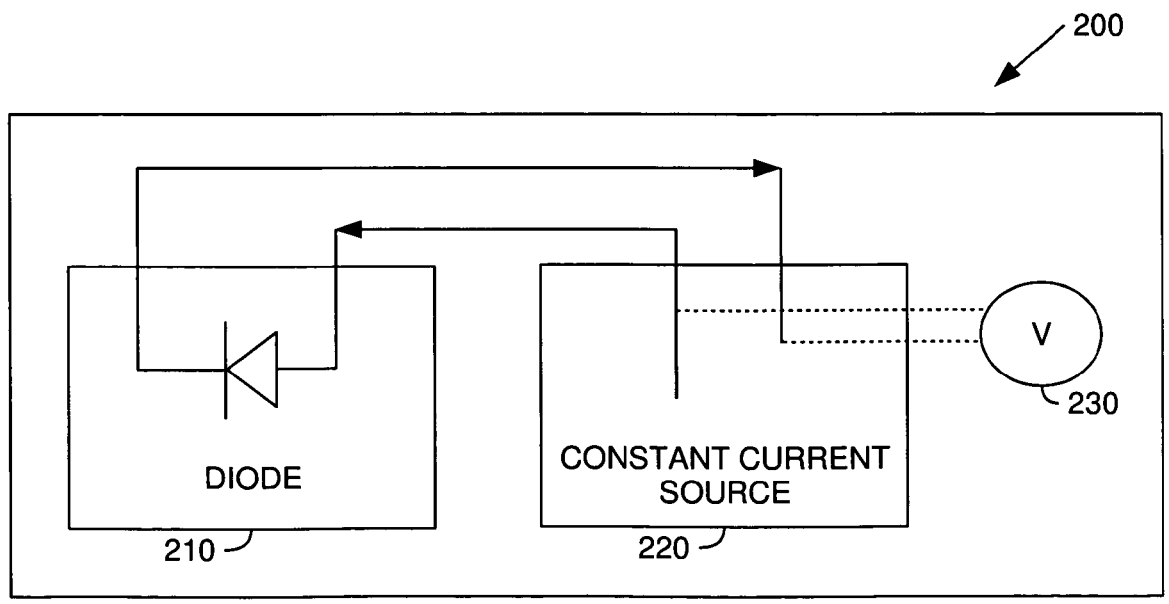
FIG. 2 (prior art) shows a temperature measurement device utilizing a diode and a constant current source.

Embodiments of the invention generally provide a gate layer diode, whose operating characteristics may be more predictable than those of a shallow junction diode such as the diode depicted in FIG. 1.

Figure 3:
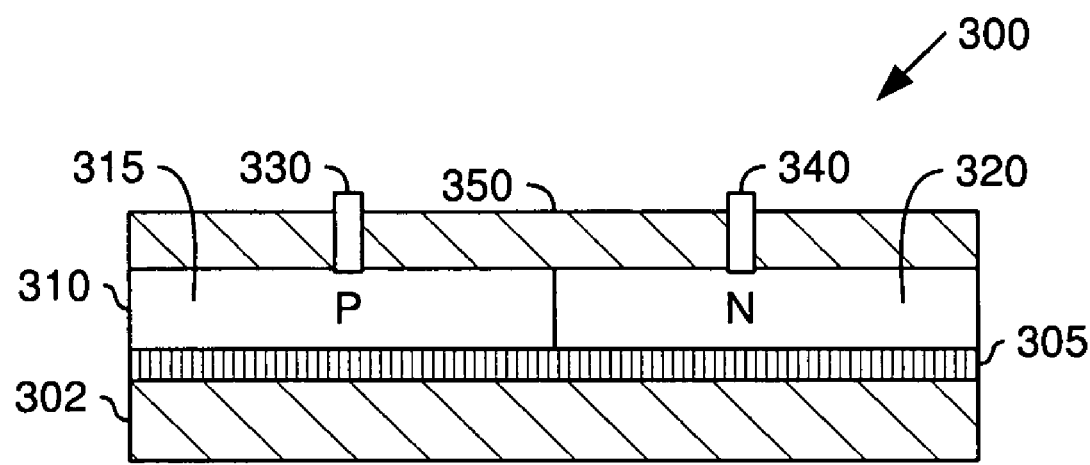
FIG. 3 is a gate layer diode according to one embodiment of the invention.

FIG. 3 depicts a gate layer diode 300. A gate layer 310 is disposed over a gate oxide layer 305, the gate oxide layer 305 insulating the gate layer 310 from an underlying substrate 302, typically made of silicon. The gate layer is typically made of polysilicon. A portion 315 (termed "anode") of the gate layer 310 has been doped with a P-type dopant. (In one embodiment, the P dopant concentration is on the order of $\sim 10^{18}/cm^3$.) Another portion 320 (termed "cathode") of the gate layer 310 has been doped with an N-type dopant. (In one embodiment, the N dopant concentration is on the order of $\sim 10^{18}/cm^3$.) The anode 315 and the cathode 320 constitute terminals of the diode. Contacts 330, 340 are typically made of metal such as copper or aluminum, and enable the diode to be connected externally. A nitride layer 350 (in one embodiment, nitride layer thickness is approximately 1000 A) provides electrical insulation. In a particular embodiment, the thickness of the gate layer may be approximately 1000 A, although a gate layer of smaller thickness or larger thickness is also contemplated. The thickness of the gate layer, which may be greater than the depth dimension of a conventional shallow junction diode (e.g., approximately 500 A), may contribute to a more predictable junction doping profile in each of the doped regions, and also may help to eliminate unpredictable diode behavior due to the presence of nearby shallow trench isolation structures. In particular, the gate layer diode 300 may exhibit a more consistent, and hence predictable, voltage-temperature characteristic than that of the conventional shallow junction diode of FIG. 1.

Figure 4:
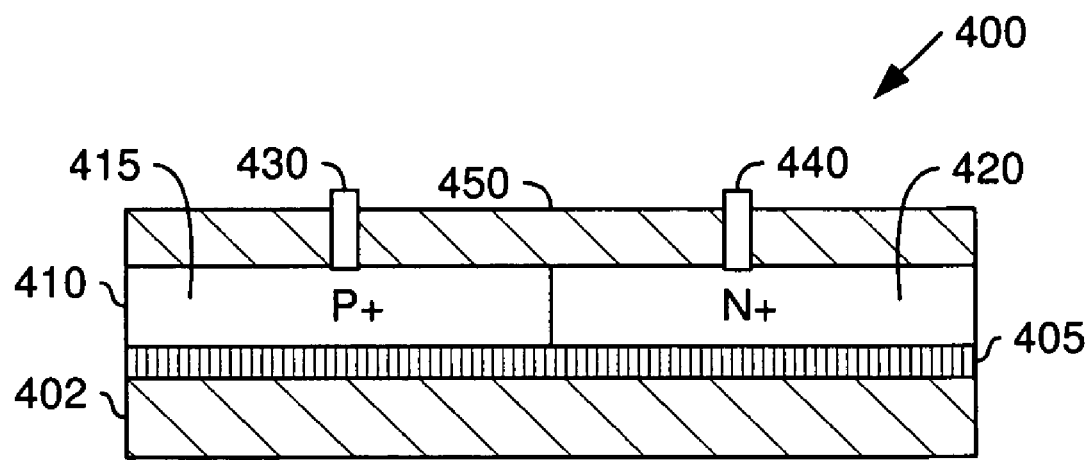
FIG. 4 is a gate layer diode employing high concentrations of dopants, according to one embodiment of the invention.

FIG. 4 shows an embodiment wherein a P-doped portion 415 (indicated as P+) is relatively higher in P concentration than that of the P-doped portion 315 of FIG. 3. A gate layer 410 is disposed over a gate oxide layer 405, the gate oxide layer insulating the gate layer 410 from an underlying substrate 402. (In one embodiment, the P+ dopant concentration is on the order of $\sim 10^{20}/cm^3$.) An N-doped portion 420 (indicated as N+) is relatively higher in N concentration than that of the N-doped portion 320 of FIG. 3. (In one embodiment, the N+ dopant concentration is on the order of $\sim 10^{20}/cm^3$.) This higher dopant concentration may result in increased consistency and predictability of the voltage-temperature characteristic of the gate layer diode, over that of the conventional shallow junction diode. Contacts 430, 440 are provided for external connection. A nitride layer 350 (in one embodiment, nitride layer thickness is approximately 1000 A) provides electrical insulation.

FIGS. 5A-D depict steps in fabricating a gate layer diode using a dual work function process, according to an embodiment of the invention. The dual work function process typically entails implanting certain portions of the gate layer with P+ dopant (for PMOS transistors) and other portions of the gate layer with N+ dopant (for NMOS transistors). Devices that employ CMOS technology, including certain DRAMs and CPUs, typically employ a dual work function process for fabrication. Accordingly, in one embodiment, a gate layer diode 500 fabricated using the dual work function process can be accomplished during the fabrication of the CMOS device on the same integrated circuit chip, thus enabling efficient manufacture of the gate layer diode without requiring additional steps above those needed for CMOS fabrication.

Figure 5A:
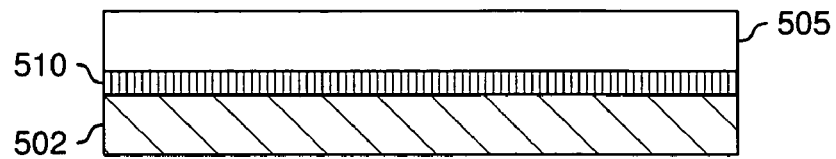
FIGS. 5 A-D depict manufacturing steps in making a gate layer diode, according to one embodiment of the invention.
Figure 5B:
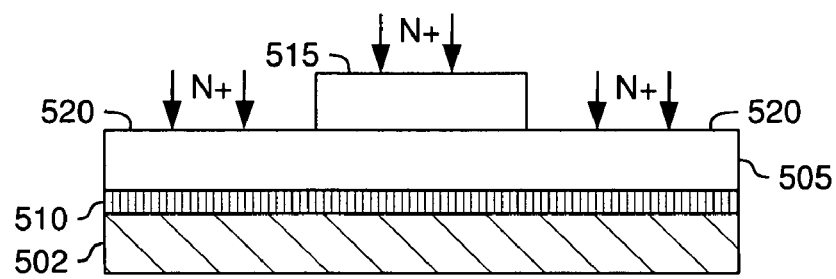

FIG. 5A shows an undoped gate layer 505 disposed over a gate oxide layer 510, the gate oxide layer 510 insulating the gate layer 505 from the substrate 502. (In each of FIGS. 5B-D, the gate oxide layer 510 insulates the gate layer 505 from the substrate 502.) In FIG. 5B, photoresist 515 has been patterned by a conventional photolithographic process prior to N+ ion implantation. Photoresist is a substance that blocks dopant ions from reaching that portion of the surface of a wafer directly beneath the photoresist. The photoresist is a photosensitive material, and is typically patterned by selectively exposing regions, via masking, to light whose wavelength is in the range of the photoresist photosensitivity, and subsequently developing the photoresist with a photodeveloping process. The resulting photoresist pattern permits doping of the gate layer to occur only at places on the surface of the wafer where the photoresist has been removed.

Figure 5C:
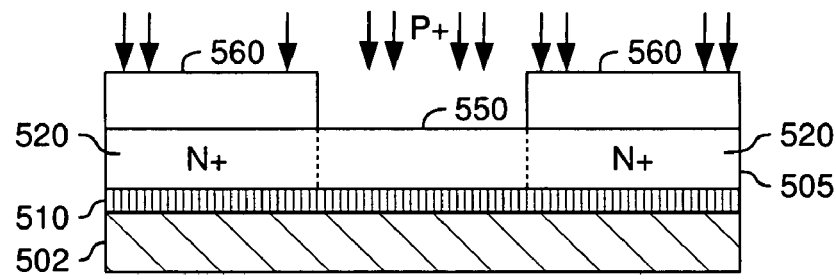
Figure 5D:
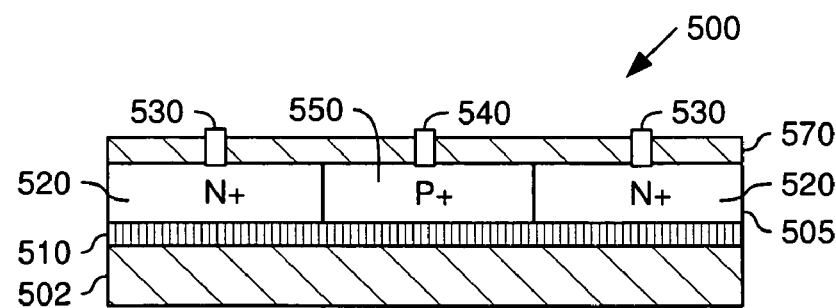

The gate layer 505 with the patterned photoresist 515 is then subjected to N-type ion implantation, resulting in N+ doping of the exposed regions 520 of the gate layer 505. This implantation may occur during the equivalent processing step in the CMOS dual work function process. In FIG. 5C, the gate layer has been patterned with photoresist 560, protecting the N-doped portions 520 against receiving P-type doping. The exposed portion 550 of the gate layer is then subjected to P-type ions (such as through ion implantation, chemical vapor deposition, or other means) to result in P+ doping of the exposed region 550. In FIG. 5D, after an electrically insulating nitride layer 570 (thickness ~1000 A) is deposited, gate patterning is completed, and then contacts 530 and 540, usually metallic, are added. The finished gate layer diode 500 is shown in FIG. 5D. In one embodiment the N+ doped regions 520 (each of which has a contact 530 that may be connected to the same external terminal) may form an annular shape surrounding the P+ doped region 550. Due in part to factors including the thickness of the gate layer 505 (typically approximately 1000 A), the doping concentrations of the doped regions, and the doping profiles of the doped regions, the gate layer diode 500 may exhibit greater predictability and consistency over that of the conventional shallow junction diode. The manufacturing process has been accomplished using the dual work function process and, at least in one embodiment, occurs without adding manufacturing steps to those employed in creating a CMOS device situated on the same chip as the gate layer diode.

Figure 6:
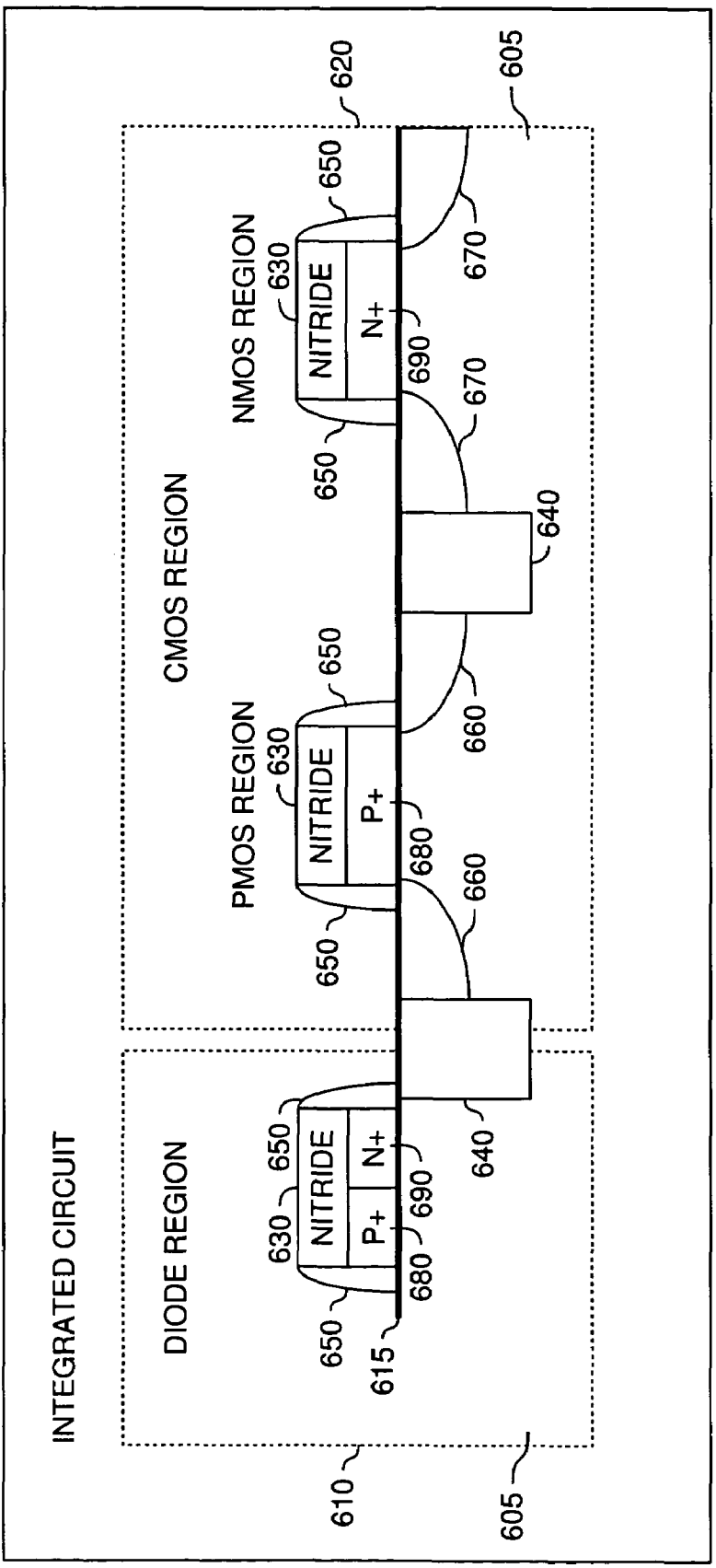
FIG. 6 depicts an integrated circuit containing a gate layer diode and a CMOS circuit, according to one embodiment of the invention.

FIG. 6 shows an integrated circuit containing both a gate layer diode 610 and a CMOS device 620. A patterned gate layer, 680 and 690, is disposed over a gate oxide layer 615, insulating the gate layer 680 and 690 from a substrate 605. A nitride layer 630 serves as an electrical insulator. PMOS transistor source/drain regions 660 are doped with P+ ions. NMOS transistor source/drain regions 670 are doped with N+ ions. Shallow trench isolation oxide 640 regions insulate source/drain regions. Gate regions 680 are doped with P ions. Gate regions 690 are doped with N ions. Gate spacers 650 electrically insulate sidewalls of the gate layer topography.

Figure 7A:
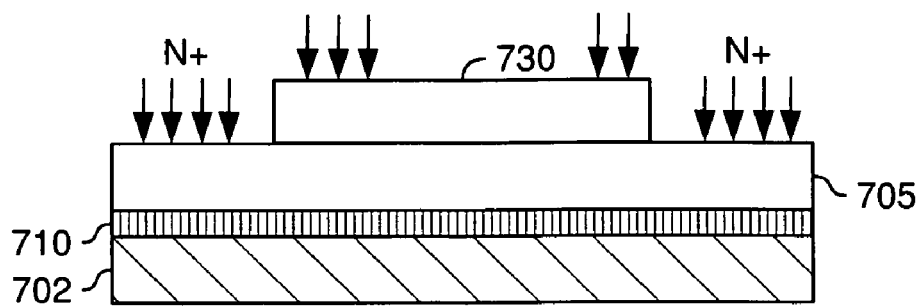
FIGS. 7 A-E depict manufacturing steps in making a gate layer diode with regions of high dopant density and regions of low dopant density, according to one embodiment of the invention.
Figure 7B:
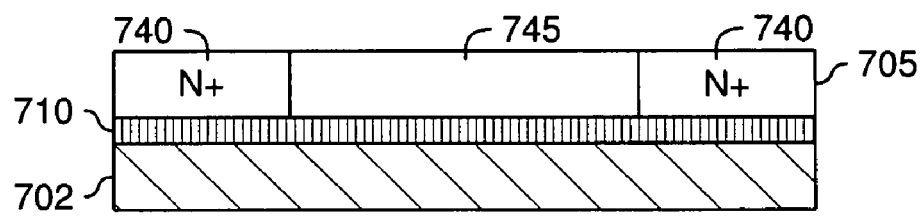
Figure 7C:
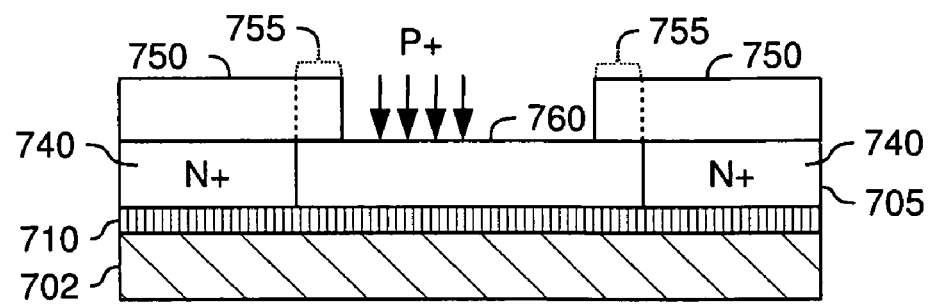
Figure 7D:
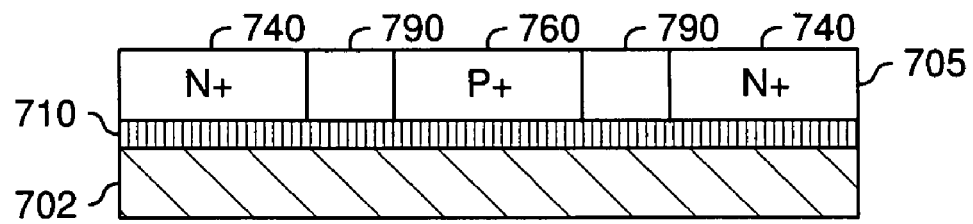
Figure 7E:
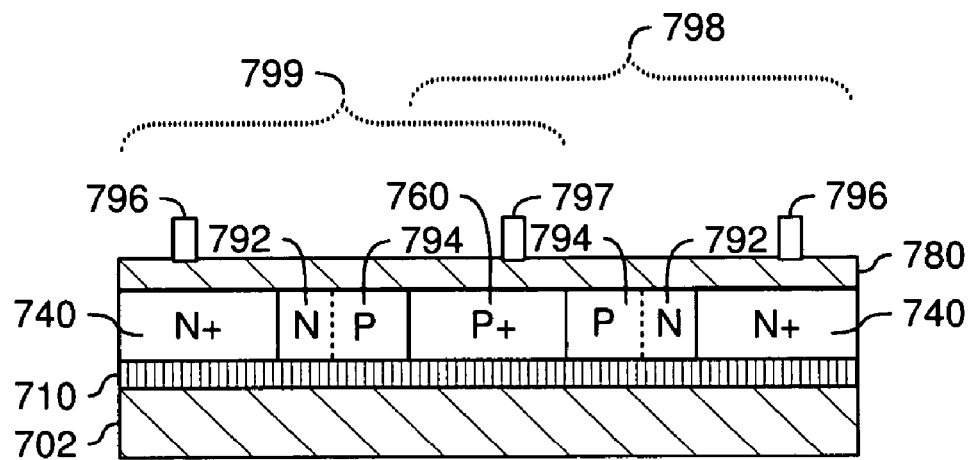
Figure 8:
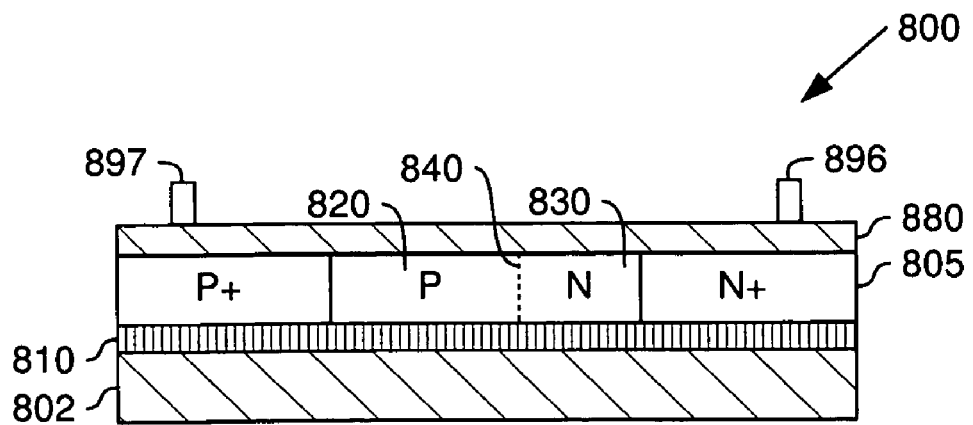
FIG. 8 depicts a gate layer diode containing regions of high dopant density and regions of low dopant density, according to one embodiment of the invention.

FIGS. 7A-E depict steps in fabricating a gate layer diode using a dual work function process, according to another embodiment of the invention. In FIGS. 7A-E, gate layer 705 is disposed over an oxide layer 710, which in turn is disposed over a silicon substrate 702. In FIG. 7A, the gate layer 705, masked by patterned photoresist 730, is subjected to an N dopant at high concentration (denoted N+), resulting in N+ doped regions 740, and undoped region 745 shown in FIG. 7B. The N-dopant may be introduced using, e.g., ion implantation, or by another doping technique. In FIG. 7C, the gate layer 705 has been masked by patterned photoresist 750. An exposed portion 760 and the patterned photoresist 750 are subjected to a P-dopant at high concentration (denoted by P+), resulting in a region of P+ doping. Due to the presence of photoresist "overhang" 755, i.e., extended portions of photoresist 750 (shown in FIG. 7C) covering portions of undoped region 745 (shown in FIG. 7B), after the patterned photoresist 750 and exposed portion 760 have been subjected to the P-dopant, there remain undoped gate layer regions 790 (shown in FIG. 7D). In FIG. 7D, the patterned photoresist 750 has been stripped. Subsequently, controlled heating, which may occur by an annealing technique such as laser or furnace annealing, results in diffusion of the N-dopant into subregions of lower N-doping, and subregions of lower P-doping. The relative sizes of the subregions may be dependent on diffusion rates of the dopants. As an example, in FIG. 7E, assuming that there is a higher diffusion rate of P-ions over that of N-ions, sub-regions 794 of P-doping are shown to be larger in size than regions 792 of N-doping. Gate layer sub-regions 740 contain N+ doping. Gate layer sub-region 760 contains P+ doping. After an electrically insulating nitride layer 780 (thickness ~1000 A) is deposited, gate patterning is completed. Contacts 796, 797 permit external electrical connection. FIG. 7E shows two diodes, 798 and 799. (In another embodiment, a single diode may consist of the N-doped sub-regions 740, 792, in an annular shape surrounding the P-doped sub-regions 760, 794.) In completed gate layer diode 800 shown in FIG. 8, gate layer 805 is disposed over a gate oxide layer 810, the oxide layer 810 insulating the gate layer 805 from an underlying substrate 802. Nitride layer 880 provides electrical insulation for contacts 896, 897. Contacts 896, 897 provide for external electrical connection. Sub-region 820 (low P-doping) and sub-region 830 (low N-doping) meet at boundary 840. Gate layer diode 800 may exhibit a temperature-voltage characteristic that is more consistent, and hence more predictable, than the embodiment depicted in FIG. 3, since high junction leakage is avoided because P+ and N+ junction do not meet each other due to the lesser dopant P and N junction boundary region.

Figure 9:
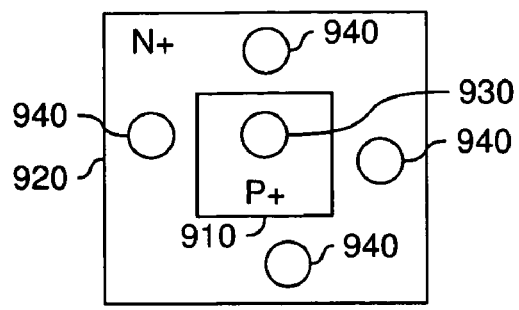
FIG. 9 depicts a top view of one layout of a gate layer diode, according to one embodiment of the invention.
Figure 10:
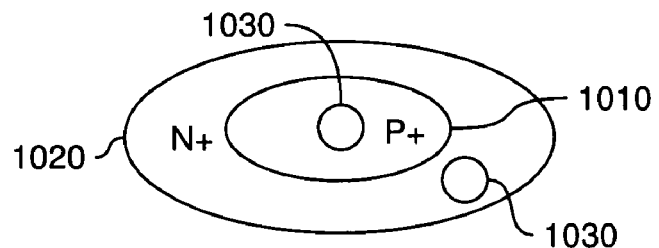
FIG. 10 depicts a top view of another layout of a gate layer diode, according to an embodiment of the invention.
Figure 11:
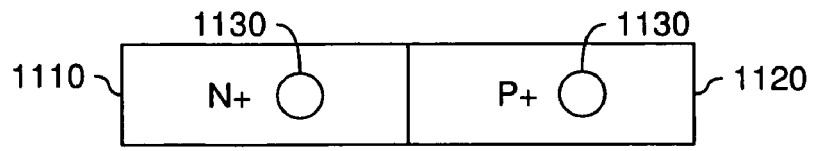
FIG. 11 depicts a top view of a layout of another gate layer diode, according to an embodiment of the invention.
Figure 12:
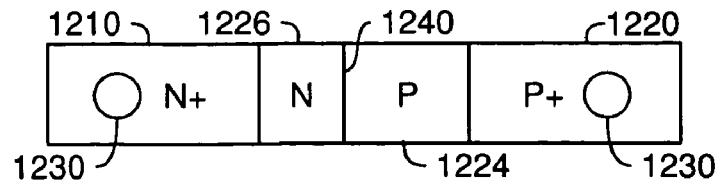
FIG. 12 depicts a top view of another layout of a gate layer diode, according to an embodiment of the invention.

Different geometries may be contemplated. FIG. 9 depicts a top view of the layout of a gate layer diode, according to an embodiment of the invention. In this embodiment, rectangular annular N+ region 920 surrounds a center P+ region 910 having a contact 930. Multiple contacts 940 to the N+ region 920 provide multiple paths for current flow. However, an embodiment containing one or more contacts 940 to the N+region 920, and one or more contacts 930 to the P+ region 910, is also contemplated. FIG. 10 depicts a top view of the layout of a gate layer diode according to another embodiment of the invention. In this embodiment, a center P+ region 1010 is surrounded by an elliptical annular N+ region 1020. FIG. 11 depicts a top view of the layout of a gate layer diode, according to another embodiment of the invention. In this embodiment, a P+ region 1110 is situated adjacent to an N+ region 1120. FIG. 12 depicts a top view of the layout of a gate layer diode, according to another embodiment of the invention. In this embodiment, a P+ region 1220 is situated adjacent to region 1224 of lower P doping. An N+ region 1210 is situated adjacent to a region 1226 of lower N-doping. The P-doped region 1224 and the N-doped region 1226 meet at boundary 1240. In the foregoing embodiments, contacts 930, 940, 1030, 1130, 1230 have a circular cross section. However, any cross-sectional shape may be used including e.g., rectangular, triangular, etc. Embodiments similar to the foregoing embodiments, with the addition of multiple contacts connected to a P+ region, or multiple contacts connected to an N+ region, providing multiple paths for current flow, are also contemplated.

Figure 13:
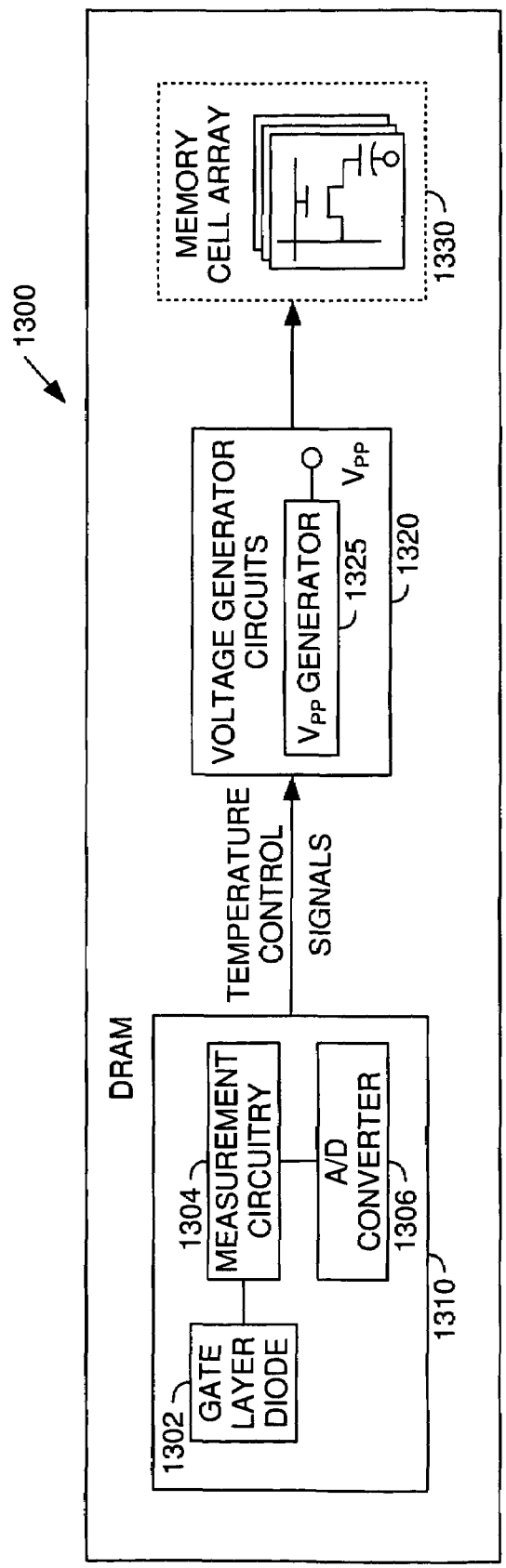
FIG. 13 depicts a temperature compensated DRAM employing a gate layer diode, according to one aspect of the invention.

The gate layer diode of the present invention may be implemented to perform a number of functions. For example, in one embodiment a gate layer diode is used as a temperature-sensing element. FIG. 13 depicts an embodiment of the invention that may be implemented using a gate layer diode described above. Temperature measurement circuitry 1310 contains a gate layer diode 1302, measurement circuitry 1304 (e.g., a constant current source and a voltage-measuring device), and an analog-to-digital (A/D) converter 1306 to convert analog temperature information to a digital output signal. The temperature measurement circuitry 1310 provides temperature information to voltage generator circuits 1320 for controlling voltage to a memory cell array 1330 of a dynamic random access memory device (DRAM). The voltage output from the temperature measurement circuitry 1310 is sent to voltage generator circuits 1320, including a boosted wordline voltage ($V_{pp}$) generator circuit 1325. The outputs of the voltage generator circuits 1320 are sent to the memory cell array 1330. For instance, it may be desired that the level of an internally generated boosted wordline voltage ($V_{pp}$) be reduced with rising device temperature, which in turn reduces subthreshold leakage current. The $V_{pp}$ generator circuit 1325 can be programmed to change $V_{pp}$ in response to an input voltage signal. A higher measured temperature, reflected in the output voltage of the temperature measurement circuitry 1310, whose output is input to the a $V_{pp}$ generator circuit 1325, can result in a reduction in $V_{pp}$, in turn reducing subthreshold leakage current.

Memory devices such as DRAMs, as well as other type devices including, but not limited to, logic circuits such as central processing units (CPUs), utilize a wide variety of internally generated voltages. As discussed above, the boosted wordline voltage ($V_{pp}$) may be reduced with rising device temperature, so as to reduce subthreshold leakage current. In addition, in a typical DRAM, the level of an internally generated back bias voltage ($V_{bb}$) may be lowered with rising device temperature to increase cell threshold voltage and improve refresh time. Additionally, or as an alternative, the level of a negative voltage applied to de-activated cell wordlines, commonly referred to as negative wordline voltage ($V_{nwl}$), may also be varied with device temperature, for example, via a temperature-controlled $V_{nwl}$ generator. $V_{nwl}$ is typically applied to wordlines via a switching transistor, in order to ensure cell transistors connected to the wordlines are well turned off in the de-activated state, in an effort to reduce leakage current. Lowering $V_{nwl}$ as temperature of a DRAM device increases, may improve refresh time by increasing reversed gate-source voltage of wordlines.

Figure 14:
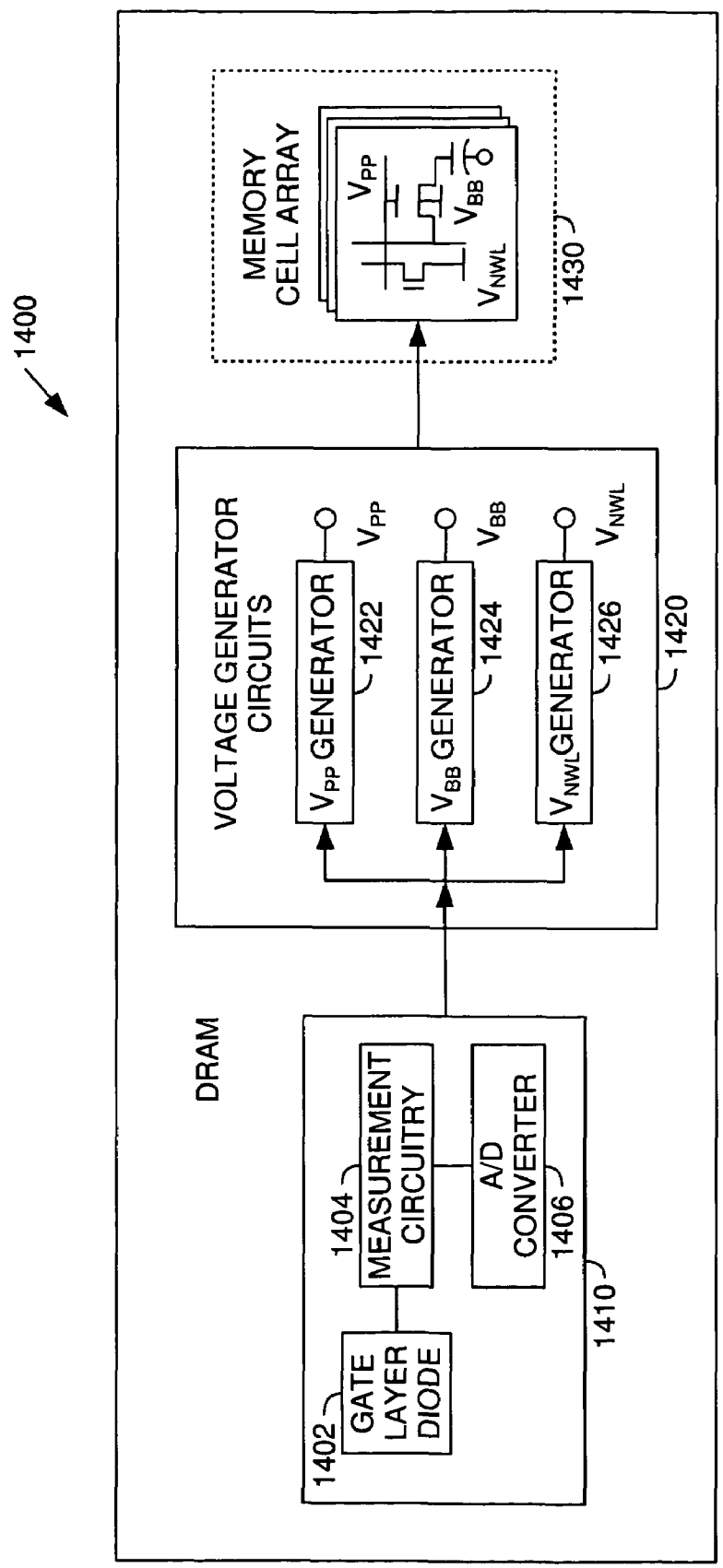
FIG. 14 depicts a temperature compensated DRAM employing a gate layer diode, wherein several memory cell voltages are controlled by the gate layer diode, according to an aspect of the invention.

Other embodiments employing a gate layer diode are contemplated, the output of which is used to generate temperature control signals for changing the output of a voltage generator circuit. They include different voltage generator circuits, and even multiple different kinds of voltage generator circuits responsive to the same temperature control signals provided by a given temperature sensor, such as the embodiment depicted in FIG. 14. Temperature measurement circuitry 1410 contains a gate layer diode 1402, measurement circuitry 1404 (e.g., a constant current source and a voltage-measuring device), and an analog-to-digital (A/D) converter 1406 to convert analog temperature information to a digital output signal. In this embodiment the output of the temperature measurement circuitry 1410 is input to voltage generator circuits 1420 that include a $V_{pp}$ generator circuit 1422, a back bias voltage ($V_{bb}$) generator circuit 1424, and a negative wordline voltage ($V_{nwl}$) generator circuit 1426. The outputs of the voltage generator circuits 1420 are sent to memory cell array 1430. The voltage generator circuits 1420 may be programmed so as to reduce overall power consumption of the integrated circuit 1400. For example, the $V_{pp}$ generator circuit 1422 may be programmed so that input from the temperature measurement circuitry 1410 indicating a rise in the temperature of the device 1400, causes a reduction in the output voltage of the $V_{pp}$ generator circuit 1422, which in turn may reduce subthreshold leakage current in the memory cell array 1430. In similar fashion, the $V_{bb}$ voltage generator 1424 may be programmed so that, upon receiving input from the temperature measurement circuitry 1410 indicating an increase in the temperature of the device 1400, the $V_{bb}$ voltage generator 1424 reduces the voltage of the $V_{bb}$ sent to the memory cell array 1430, typically resulting in improved refresh time. The $V_{nwl}$ generator 1426 may be programmed so that an increase in the temperature of the device 1400 as measured by temperature measurement circuitry 1410, results in a reduction of the output voltage $V_{nwl}$, which is in turn sent to the memory cell array 1430 and may improve refresh time of the DRAM 1400. Although the voltage generator circuits 1422, 1424, 1426 shown in FIG. 14 receive input based from the same temperature sensing element and sensing circuitry 1402, it is also contemplated that each voltage generator may receive input from its own temperature sensing element and sensing circuitry.

In light of the present disclosure, one skilled in the art will recognize that the techniques described herein may be used to vary any of these internally generated voltages based on temperature in order to achieve a variety of different results. Similarly, voltages used in other circuitry (e.g., logic circuits including CPUs) may be similarly varied based on temperature in order to, e.g., reduce power consumption.

Figure 15:
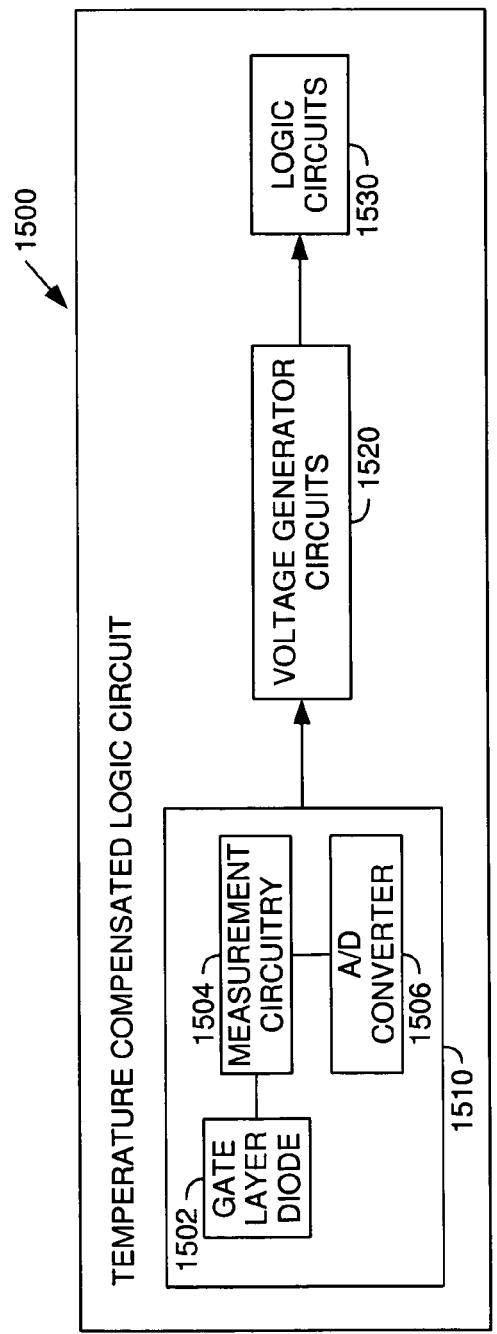
FIG. 15 depicts a temperature compensated logic circuit employing a gate layer diode, according to one aspect of the invention.

FIG. 15 depicts another embodiment according to the invention. In this temperature compensated logic circuit 1500, the output voltage of temperature measurement circuitry 1510 that employs a gate layer diode as a temperature sensing element, may be used to measure the ambient chip temperature. Temperature measurement circuitry 1510 contains a gate layer diode 1502, measurement circuitry 1504 (e.g., a constant current source and a voltage-measuring device), and an analog-to-digital (A/D) converter 1506 to convert analog temperature information to a digital output signal. The output of the temperature measurement circuitry 1510 is sent to voltage generator circuits 1520, whose outputs are sent to logic circuits 1530. The output voltages of the voltage generator circuits 1520 may be programmed so as to reduce power consumption of the logic circuits 1530 in response to a rising temperature of the temperature compensated logic circuit 1500.

Figure 16:
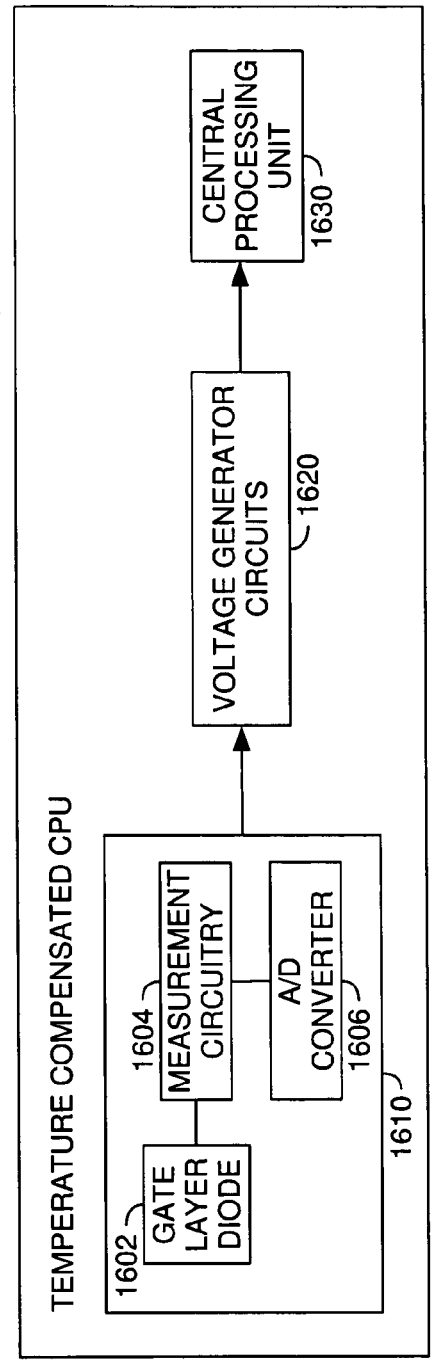
FIG. 16 depicts a temperature compensated CPU employing a gate layer diode, according to one aspect of the invention.

FIG. 16 depicts an embodiment according to the invention. In this temperature compensated CPU 1600, temperature measurement circuitry 1610 employing a gate layer diode as a temperature sensing element may be used to measure the ambient chip temperature. Temperature measurement circuitry 1610 contains a gate layer diode 1602, measurement circuitry 1604 (e.g., a constant current source and a voltage-measuring device), and an analog-to-digital (A/D) converter 1606 to convert analog temperature information to a digital output signal. The output of the temperature measurement circuitry 1610 is sent to voltage generator circuits 1620, whose outputs are sent to a Central Processing Unit (CPU) 1630. The voltage generator circuits 1620 may be programmed so that their respective output voltages are adjusted in response to a temperature change, as measured by temperature measurement circuitry 1610 so as to reduce power consumption of the CPU 1630.

Those skilled in the art will also recognize that many different types of detector and reference circuitry may be utilized and that the exact circuitry used to vary the output level of either based on temperature may vary according to the exact type of circuitry utilized. Thus, the gate layer diode may be combined with other reference circuitry, the outputs of which may be used as input to various voltage generators, which in turn control various parameters of circuitry so as to optimize performance of that circuitry.

Although particular embodiments (e.g., a temperature sensor diode) employing a gate layer diode have been described, other uses of a gate layer diode are contemplated, including but not limited to, general diode use, and in applications such as a band gap diode for use in, e.g., a voltage regulator and a self refresh frequency control circuit.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising a patterned gate layer comprising;
   a diode region in which a gate layer diode is formed, the gate layer diode comprising:
      a first portion of the gate layer containing a P-type dopant to form a first doped portion of the diode and a second portion of the gate layer adjacent to the first portion containing an N-type dopant to form a second doped portion of the diode, wherein the first doped portion and the second doped portion define first and second terminals of the diode; and
      a first electrically conductive contact disposed on the first doped portion of the diode and a second electrically conductive contact disposed on the second doped portion of the diode, wherein the first electrically conductive contact and the second electrically conductive contact are configured to apply a voltage serially across the first and second terminals of the gate layer diode; and
   a CMOS region separate from the diode region in which a CMOS device is formed, the CMOS device comprising a PMOS region in which a PMOS transistor is formed and an NMOS region in which an NMOS transistor is formed, wherein a third doped portion of the gate layer forms a transistor gate of the PMOS transistor and a fourth doped portion of the gate layer forms a transistor gate of the NMOS transistor, and wherein a spacer material is formed along sidewall portions of the gate layer diode and the third and fourth doped portions.

2. The integrated circuit of claim 1, wherein the gate layer comprises polysilicon.

3. The integrated circuit of claim 1, wherein the gate layer is deposited on an oxide layer, the oxide layer disposed over a substrate.

4. The integrated circuit of claim 1, further comprising:
a diffusion region between the first doped portion of the diode and the second doped portion of the diode, the diffusion region being formed by diffusion of the first dopant and the second dopant into the diffusion region, wherein the diffusion region is a part of at least one of the terminals.

5. The integrated circuit of claim 4, wherein the diffusion region comprises:
a relatively lower first dopant concentration relative to the first portion of the diode; and
a relatively lower second dopant concentration relative to the second portion of the diode.

6. The integrated circuit of claim 4, wherein the diffusion region comprises:
a first diffusion region having a relatively lower first dopant concentration relative to the first portion of the diode; and
a second diffusion region having a relatively lower second dopant concentration relative to the second portion of the diode.

7. The integrated circuit of claim 1, wherein the first doped portion and the third doped portion contain the P-type dopant in equal concentration, and the second and fourth doped portions contain the N-type dopant in equal concentration.

8. The integrated circuit of claim 1, wherein a shallow trench isolation oxide separates the diode region from the CMOS region.

9. A chip, comprising:
a gate layer;
a diode region having a gate layer diode formed in a first portion of the gate layer;
a first electrically conductive contact formed on a first terminal of the gate layer diode and a second electrically conductive contact formed on a second terminal of the gate layer diode, wherein the first electrically conductive contact and the second electrically conductive contact are configured to apply a voltage serially across the first terminal and the second terminal of the gate layer diode; and
a separate CMOS region having a CMOS device, the CMOS device comprising a PMOS region in which a PMOS transistor is formed and an NMOS region in which an NMOS transistor is formed, wherein the first terminal of the gate layer diode, the second terminal of the gate layer diode, a transistor gate of the PMOS transistor, and a transistor gate of the NMOS transistor are formed within the gate layer, and wherein a spacer material is formed along sidewall portions of the gate layer diode and the transistor gates of the PMOS device and NMOS device.

10. The chip of claim 9, wherein the gate layer is deposited on an oxide layer, the oxide layer being disposed over a substrate.

11. The chip of claim 9, wherein the first terminal contains a P-type dopant in a concentration equal to the transistor gate of the PMOS transistor, and the second terminal contains N-type dopant in a concentration equal to the transistor gate of the NMOS transistor.

12. The chip of claim 9, wherein a shallow trench isolation oxide separates the diode region from the CMOS transistor.

13. A method for making an integrated circuit, comprising:
forming a gate layer;
doping a first portion of the gate layer with a P-type dopant to form a first doped portion of a diode;
doping a second portion of the gate layer adjacent to the first portion with a N-type dopant to form a second doped portion of the diode, wherein the first doped portion and the second doped portion define terminals of the diode;
forming a first electrically conductive contact disposed on the first doped portion of the diode; and
forming a second electrically conductive contact disposed on the second doped portion of the diode, wherein the first electrically conductive contact and the second electrically conductive contact are configured to apply a voltage serially across the terminals of the gate layer diode;
doping a third portion of the gate layer, the third portion forming a transistor gate of a PMOS transistor;
doping a fourth portion of the gate layer, the fourth portion forming a transistor gate of a NMOS transistor, wherein the PMOS transistor and NMOS transistor form a CMOS transistor; and
forming a spacer material along sidewall portions of the diode, the third portion, and the fourth portion.

14. The method of claim 13, wherein the gate layer comprises polysilicon.

15. The method of claim 13, wherein the gate layer is deposited on an oxide layer, the oxide layer disposed over a substrate.

16. The method of claim 13, further comprising:
forming a diffusion region between the first doped portion of the diode and the second doped portion of the diode, the diffusion region being formed by diffusion of the first dopant and the second dopant into the diffusion region, wherein the diffusion region is a part of at least one of the terminals.

17. The method of claim 16, wherein the diffusion region comprises:
a relatively lower first dopant concentration relative to the first portion of the diode; and
a relatively lower second dopant concentration relative to the second portion of the diode.

18. The method of claim 16, wherein the diffusion region comprises:
a first diffusion region having a relatively lower first dopant concentration relative to the first portion of the diode; and
a second diffusion region having a relatively lower second dopant concentration relative to the second portion of the diode.

19. The method of claim 13, wherein the first doped portion define an anode of the diode and the second doped portion define a cathode of the diode.

20. The method of claim 13, wherein the gate layer is provided over a substrate and wherein the first doped portion and the second doped portion are formed by:
forming a first patterned photoresist layer on the gate layer, whereby a first exposed portion of the gate layer is defined;

with the first patterned photoresist layer on the gate layer, doping the first exposed portion with the first dopant to form the first doped portion of the diode, resulting in an undoped region of the gate layer shielded by the first patterned photoresist layer;

removing the first patterned photoresist layer;

forming a second patterned photoresist layer on the first doped portion of the diode and extending at least partially over the undoped region, whereby a second exposed portion of the gate layer is defined from the undoped region; and with the second patterned photoresist layer on the first doped portion, doping the second exposed portion with the second dopant to form the second doped portion of the diode.

21. The method of claim 20, wherein the second patterned photoresist layer entirely covers the first doped portion of the diode during doping of the second exposed portion.

22. The method of claim 20, further comprising:

following doping with the first and second dopants, forming a diffusion region between the first doped portion of the diode and the second doped portion of the diode, the diffusion region being formed by diffusion of the first dopant and the second dopant into the diffusion region, wherein the diffusion region is a part of at least one of the terminals.

23. The method of claim 22, wherein the diffusion region comprises:

a relatively lower first dopant concentration relative to the first doped portion of the diode; and a relatively lower second dopant concentration relative to the second doped portion of the diode.

24. The method of claim 22, wherein the diffusion region comprises:

a first diffusion region having a relatively lower first dopant concentration relative to the first doped portion of the diode; and a second diffusion region having a relatively lower second dopant concentration relative to the second doped portion of the diode.

25. The method of claim 22, wherein the diffusion region is formed by heating the gate layer.

26. A method for making an integrated circuit, comprising:

forming a gate layer;

doping a first portion of the gate layer with a P-type dopant to form a first doped portion of a diode;

doping a second portion of the gate layer adjacent to the first portion with a N-type dopant to form a second doped portion of the diode, wherein the first doped portion and the second doped portion define terminals of the diode;

forming a first electrically conductive contact disposed on the first doped portion of the diode;

forming a second electrically conductive contact disposed on the second doped portion of the diode, wherein the first electrically conductive contact and the second electrically conductive contact are configured to apply a voltage serially across the terminals of the gate layer diode;

doping a third portion of the gate layer to form a third doped portion of the gate layer forming a transistor gate of a PMOS transistor; and doping a fourth portion of the gate layer to form a fourth doped portion of the gate layer forming a transistor gate of an NMOS transistor, the PMOS transistor and the NMOS transistor being a part of a CMOS device formed in a CMOS region, and the diode being formed in a diode region separate from the CMOS region, wherein the doping of the first and second portions is performed within a same dual work function process as the doping the third and the fourth portions.

* * * * *